US012322637B2

(12) United States Patent
Muto et al.

(10) Patent No.: US 12,322,637 B2
(45) Date of Patent: Jun. 3, 2025

(54) WAFER PROCESSING LAMINATE, TEMPORARY ADHESIVE MATERIAL FOR WAFER PROCESSING, AND METHOD FOR MANUFACTURING THIN WAFER

(71) Applicant: SHIN-ETSU CHEMICAL CO., LTD., Tokyo (JP)

(72) Inventors: Mitsuo Muto, Takasaki (JP); Shohei Tagami, Annaka (JP); Michihiro Sugo, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 533 days.

(21) Appl. No.: 17/641,733

(22) PCT Filed: Sep. 17, 2020

(86) PCT No.: PCT/JP2020/035309
§ 371 (c)(1),
(2) Date: Mar. 9, 2022

(87) PCT Pub. No.: WO2021/065547
PCT Pub. Date: Apr. 8, 2021

(65) Prior Publication Data
US 2022/0352001 A1     Nov. 3, 2022

(30) Foreign Application Priority Data
Sep. 30, 2019 (JP) .................... 2019-178951

(51) Int. Cl.
*H01L 21/683* (2006.01)
*B32B 7/12* (2006.01)
(Continued)

(52) U.S. Cl.
CPC ............ *H01L 21/6836* (2013.01); *B32B 7/12* (2013.01); *B32B 9/04* (2013.01); *B32B 17/06* (2013.01);
(Continued)

(58) Field of Classification Search
CPC ....... C09J 183/00–183/16; H01L 21/00–21/86
See application file for complete search history.

(56) References Cited

U.S. PATENT DOCUMENTS

| 7,541,264 B2 | 6/2009 | Gardner et al. |
| 2005/0233547 A1 | 10/2005 | Noda et al. |

(Continued)

FOREIGN PATENT DOCUMENTS

| CN | 105273643 A | 1/2016 |
| CN | 105470188 A | 4/2016 |

(Continued)

OTHER PUBLICATIONS

Machine translation of JP2015214637. Retrieved Oct. 31, 2024.*
(Continued)

*Primary Examiner* — Prashant J Khatri
(74) *Attorney, Agent, or Firm* — Oliff PLC

(57) ABSTRACT

A temporary adhesive material for wafer processing temporarily bonds a support to a wafer having a circuit-forming front and back surface for processing, including a composite temporary adhesive material layer having at least a two-layer structure of first and second temporary adhesive layers, the first layer including a thermoplastic resin layer that is releasably adhered to the wafer's front surface; and the second layer including a photo-curing siloxane polymer layer laminated on the first layer. A wafer processing laminate, a temporary adhesive material for wafer processing, and a method for manufacturing a thin wafer using the same, which suppress wafer warpage at the time of heat-bonding, (Continued)

have excellent delaminatability and cleaning removability, allow layer formation with uniform film thickness on a heavily stepped substrate, are highly compatible with steps of forming TSV, etc., have excellent thermal process resistance, and are capable of increasing productivity of thin wafers.

15 Claims, 1 Drawing Sheet

(51) Int. Cl.
  *B32B 9/04* (2006.01)
  *B32B 17/06* (2006.01)
  *B32B 37/12* (2006.01)
  *B32B 37/18* (2006.01)
  *B32B 38/00* (2006.01)
  *B32B 43/00* (2006.01)
  *C09J 7/38* (2018.01)
  *H01L 21/306* (2006.01)

(52) U.S. Cl.
  CPC ............ *B32B 37/12* (2013.01); *B32B 37/18* (2013.01); *B32B 38/0012* (2013.01); *B32B 43/006* (2013.01); *C09J 7/38* (2018.01); *H01L 21/30625* (2013.01); *B32B 2037/1253* (2013.01); *B32B 2038/0064* (2013.01); *B32B 2255/26* (2013.01); *B32B 2307/748* (2013.01); *B32B 2309/12* (2013.01); *B32B 2310/0843* (2013.01); *B32B 2313/00* (2013.01); *B32B 2315/08* (2013.01); *B32B 2457/14* (2013.01); *C09J 2203/326* (2013.01); *C09J 2301/208* (2020.08); *C09J 2400/22* (2013.01); *C09J 2483/00* (2013.01)

(56) References Cited

U.S. PATENT DOCUMENTS

| 2007/0218299 | A1 | 9/2007 | Azechi | |
|---|---|---|---|---|
| 2014/0106137 | A1 | 4/2014 | Kondo et al. | |
| 2014/0342530 | A1* | 11/2014 | Yasuda | H01L 21/6835 428/355 R |
| 2015/0353793 | A1 | 12/2015 | Yasuda et al. | |
| 2016/0093522 | A1 | 3/2016 | Tagami et al. | |
| 2016/0168422 | A1* | 6/2016 | Iwai | C09J 4/06 522/182 |
| 2016/0189996 | A1* | 6/2016 | Tanabe | H01L 21/6835 438/692 |
| 2017/0069521 | A1* | 3/2017 | Sugo | B32B 27/283 |
| 2017/0352637 | A1 | 12/2017 | Yasuda et al. | |
| 2021/0139700 | A1 | 5/2021 | Arimoto et al. | |

FOREIGN PATENT DOCUMENTS

| CN | 107458042 A | | 12/2017 |
|---|---|---|---|
| CN | 108603028 A | | 9/2018 |
| JP | 2004-064040 A | | 2/2004 |
| JP | 2006-328104 A | | 12/2006 |
| JP | 2007-246842 A | | 9/2007 |
| JP | 2013-71984 A | | 4/2013 |
| JP | 2014-096563 A | | 5/2014 |
| JP | 2014-241399 A | | 12/2014 |
| JP | 2015-050268 A | | 3/2015 |
| JP | 2015214637 A | * | 12/2015 |
| JP | 2016-086158 A | | 5/2016 |
| JP | 2017-050322 A | | 3/2017 |
| TW | 201509687 A | | 3/2015 |

OTHER PUBLICATIONS

Jan. 23, 2024 extended Search Report issued in European Patent Application No. 20872560.6.
Jan. 18, 2024 Office Action issued in Chinese Patent Application No. 202080067798.5.
Jul. 4, 2023 Office Action issued in Chinese Patent Application No. 202080067798.5.
Apr. 17, 2024 Office Action issued in Chinese Patent Application No. 202080067798.5.
Zhang, Zhicheng et al.; "Polymer Radiation Chemistry"; University of Science and Technology of China Press; p. 149, Jul. 2000.
Li Langting et al.; "Wood Processing Materials"; Northeast Forestry University Press; p. 19, Mar. 1992.
Zhou Jianping et al.; "Experiment in Polymer Materials and Engineering"; Beihang University Press; p. 27, Oct. 2018.
Zhang Yulong et al.; "Bonding technical manual"; China Light Industry Press; p. 129, Aug. 2001.
Oct. 5, 2023 Office Action issued in Taiwanese Patent Application No. 109133609.
Apr. 11, 2023 Office Action Issued in Japanese Patent Application No. 2021-550610.
Nov. 10, 2020 Search Report issued in International Application No. PCT/JP2020/035309.
Apr. 5, 2022 International Preliminary Report on Patentability issued in International Patent Application No. PCT/JP2020/035309.
Jun. 19, 2024 Office Action issued in Taiwanese Application No. 109133609.
Nov. 19, 2024 Office Action issued in Korean Application 10-2022-7009414.

* cited by examiner

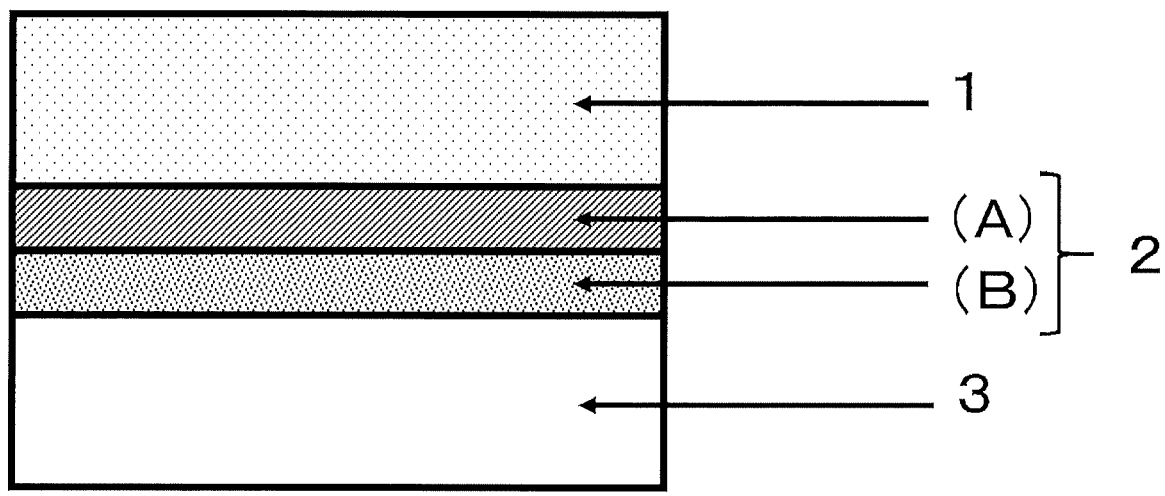

WAFER PROCESSING LAMINATE, TEMPORARY ADHESIVE MATERIAL FOR WAFER PROCESSING, AND METHOD FOR MANUFACTURING THIN WAFER

TECHNICAL FIELD

The present invention relates to: an adhesive material for wafer processing that makes it possible to obtain a thin wafer effectively; a wafer processing laminate; and a method for manufacturing a thin wafer.

BACKGROUND ART

Three-dimensional semiconductor mounting has become essential for higher density and larger capacity. The three-dimensional mounting technique is a semiconductor production technique for thinning a semiconductor chip and connecting the chip to another chip by a through silicon via (TSV) electrode to form a multilayer. Realizing this requires steps of thinning a substrate by grinding a non-circuit-forming surface (also referred to as "back surface") of the substrate on which a semiconductor circuit has been formed, followed by forming an electrode including a TSV on the back surface. Conventionally, in the step of grinding the back surface of a silicon substrate, a protective tape for the back surface is attached to a surface opposite to a surface to be ground to prevent the wafer from breaking during grinding. However, this tape uses an organic resin film as the base material, which has flexibility, but inadequate strength and heat resistance. Therefore, this tape is not suited to the steps of forming a TSV and forming a wiring layer on the back surface.

In this context, there has been suggested a system of bonding a semiconductor substrate to a support made of silicon, glass or the like via an adhesive layer, making it possible to sufficiently withstand the steps of grinding the back surface and forming a TSV and an electrode on the back surface. The key to this system is the adhesive layer used for bonding the substrate to the support. The adhesive layer is required to bond the substrate to the support without gaps and to have sufficient durability to withstand subsequent steps, and is also required to allow the thin wafer to be easily separated from the support finally. As described above, this adhesive layer is finally removed and is referred to as "temporary adhesive layer" (or temporary adhesive material layer) in this description.

With respect to the conventionally known temporary adhesive layer and a method for removing this layer, the following techniques have been proposed: an adhesive material containing a light-absorbing substance is irradiated with high intensity light to decompose the adhesive material layer whereby the adhesive material layer is removed from the support (Patent Document 1); and a heat fusible hydrocarbon compound is used for the adhesive material, and bonding and removal are carried out in a heat-molten state (Patent Document 2). The former technique has problems of requiring expensive tools such as laser, a long treatment time per substrate, and so forth. The latter technique is simple because of control only by heat, but thermal stability is insufficient at a high temperature exceeding 200° C., and thus the applicable range is limited. Furthermore, these temporary adhesive layers are not adequate to form a film with uniform thickness on a heavily stepped substrate and to provide a complete adhesion to the support.

A technique of using a silicone adhesive agent for the temporary adhesive material layer has been proposed. This is to bond a substrate to a support by using a heat curable type silicone adhesive agent, and on delamination, the assembly is immersed in a chemical solution capable of dissolving or decomposing the silicone resin, whereby the substrate is separated from the support (Patent Document 3). Thus, this method takes a very long time for delamination and it is difficult to apply the method to an actual manufacturing process. In addition, it also takes a long time to clean off the silicone adhesive agent remaining on the substrate as a residue after the delamination, so that the method also has a problem regarding cleaning removability. Meanwhile, in the bonding process, heating at about 150° C. is necessary when a heat curable type silicone is used, so that warpage of the wafer is sometimes a problem especially when the heating is performed on a hot plate. When the bonding is attempted at a low temperature in order to suppress the warpage of the wafer, there is a problem that it takes a long time to complete the curing.

CITATION LIST

Patent Literature

Patent Document 1: JP 2004-64040 A
Patent Document 2: JP 2006-328104 A
Patent Document 3: U.S. Pat. No. 7,541,264 B2

SUMMARY OF INVENTION

Technical Problem

The present invention has been made in view of the above-described problems, and has an object to provide a wafer processing laminate, a temporary adhesive material for wafer processing, and a method for manufacturing a thin wafer using the same, which suppress wafer warpage at the time of bonding, have excellent delaminatability and cleaning removability, allow the formation of a layer with uniform film thickness on a heavily stepped substrate, are highly compatible with steps of forming a TSV and forming a wiring on the back surface of the wafer, have excellent resistance to a thermal process for wafer such as CVD (chemical vapor deposition), and are capable of increasing productivity of thin wafers.

Solution to Problem

To achieve the object, the present invention provides a temporary adhesive material for wafer processing, the temporary adhesive material temporarily bonding a support to a wafer having a circuit-forming front surface and a back surface to be processed, comprising
  a composite temporary adhesive material layer having a two-layer structure of a first temporary adhesive layer and a second temporary adhesive layer,
  the first temporary adhesive layer comprising a thermoplastic resin layer (A) that can be releasably adhered to the front surface of the wafer; and
  the second temporary adhesive layer comprising a photo-curing siloxane polymer layer (B) laminated on the first temporary adhesive layer.

In the inventive temporary adhesive material for wafer processing, a photo-curing siloxane polymer layer is used as the second temporary adhesive layer, so that bonding can be performed without heating and in a short time compared with a conventional heat curable siloxane polymer layer. This allows the reduction of wafer warpage when bonding and the shortening of bonding time. Furthermore, the obtained temporary adhesive material has both excellent delaminatability into the substrate and the support and excellent cleaning removability from the substrate and the support. Moreover, the inventive temporary adhesive material for wafer processing allows the formation of a layer with uniform film thickness on a heavily stepped substrate, is highly compatible with steps of forming a TSV and forming a wiring on the back surface of the wafer, has excellent resistance to a thermal process for wafer such as CVD, and is capable of increasing productivity of thin wafers.

Furthermore, in the present invention, the photo-curing siloxane polymer layer (B) is preferably a cured layer of a photo-curing siloxane composition containing:
- (B-1) an organopolysiloxane having two or more alkenyl groups in a molecule thereof;
- (B-2) an organohydrogenpolysiloxane having two or more silicon atom-bonded hydrogen atoms (i.e. Si—H groups) per molecule in such an amount that a mole ratio of the Si—H groups in the component (B-2) to the alkenyl groups in the component (B-1) ranges from 0.3 to 10; and
- (B-3) 1 to 5,000 ppm of a photoactive hydrosilylation reaction catalyst based on a total mass of the component (B-1) and the component (B-2) in terms of an amount of metal atoms.

A temporary adhesive material for wafer processing having such a photo-curing siloxane polymer layer (B) is more excellent in CVD resistance.

In this case, the photo-curing siloxane composition preferably further contains a hydrosilylation reaction inhibitor as a component (B-4), and the component (B-3) is preferably contained in an amount of 1 to 5,000 ppm based on a total mass of the component (B-1), the component (B-2), and the component (B-4) in terms of an amount of metal atoms.

When such a temporary adhesive material for wafer processing is used, thickening viscosity and gelation of the solution to be treated (i.e. the photo-curing siloxane composition) hardly occur before curing.

Furthermore, in the photo-curing siloxane composition, the photoactive hydrosilylation reaction catalyst of the component (B-3) is preferably one or both of a ($\eta^5$-cyclopentadienyl)tri($\sigma$-alkyl)platinum(IV) complex and a $\beta$-diketonato platinum(II) complex.

In such a temporary adhesive material for wafer processing, the component (B-3) photoactive hydrosilylation reaction catalyst shows catalytic activity under UV light of UV-B to UV-A, so that damage to the wafer can be suppressed.

Furthermore, in the inventive temporary adhesive material for wafer processing, after the photo-curing siloxane polymer layer (B) is cured, a 180° peeling force against the thermoplastic resin layer (A) measured at 25° C. by using a test piece having a width of 25 mm is preferably 2 gf (0.0196 N) or more and 50 gf (0.490 N) or less.

When the temporary adhesive material for wafer processing has a photo-curing siloxane polymer layer (B) having such a peeling force, there is no risk of slippage of the wafer occurring when grinding the wafer, and delamination becomes easier.

Furthermore, in the inventive temporary adhesive material for wafer processing, after the photo-curing siloxane polymer layer (B) is cured, a storage modulus at 25° C. is preferably 1,000 Pa or more and 1,000 MPa or less.

When the temporary adhesive material for wafer processing is provided with a photo-curing siloxane polymer layer (B) having such a storage modulus, there is no risk of slippage of the wafer occurring during wafer grinding, and the material is also stable during thermal processing of the wafer.

Furthermore, in the inventive temporary adhesive material for wafer processing, the thermoplastic resin layer (A) is preferably a non-silicone resin.

Such a temporary adhesive material for wafer processing has excellent properties such as the reduction of wafer warpage at the time of bonding, the shortening of bonding time, and excellent delaminatability into the substrate and the support and cleaning removability from the substrate and the support.

In addition, the present invention provides a method for manufacturing a thin wafer, comprising the steps of:
- (a) bonding a support to a circuit-forming front surface of a wafer having the circuit-forming front surface and a non-circuit-forming back surface through a temporary adhesive material layer having the thermoplastic resin layer (A) and the photo-curing siloxane polymer layer (B) to be used for the above-described temporary adhesive material for wafer processing by forming the photo-curing siloxane polymer layer (B) on the support and bonding the resulting support to the wafer having a circuit and having the thermoplastic resin layer (A) formed under vacuum;
- (b) photo-curing the polymer layer (B);
- (c) grinding or polishing the non-circuit-forming back surface of the wafer bonded to the support;
- (d) processing the non-circuit-forming back surface of the wafer; and
- (e) delaminating the processed wafer from the support.

In addition, the present invention also provides a method for manufacturing a thin wafer, comprising the steps of:
- (a) bonding a support to a circuit-forming front surface of a wafer having the circuit-forming front surface and a non-circuit-forming back surface through a temporary adhesive material layer having the thermoplastic resin layer (A) and the photo-curing siloxane polymer layer (B) to be used for the above-described temporary adhesive material for wafer processing by forming the thermoplastic resin layer (A) on the wafer having a circuit and forming on the support the photo-curing siloxane polymer layer (B) that is subjected to irradiation with light;
- (b) bonding the wafer having a circuit and having the thermoplastic resin layer (A) formed to the support having the polymer layer (B) formed under vacuum;
- (c) grinding or polishing the non-circuit-forming back surface of the wafer bonded to the support;
- (d) processing the non-circuit-forming back surface of the wafer; and
- (e) delaminating the processed wafer from the support.

When such a method for manufacturing a thin wafer is employed, a thin wafer having a through electrode structure or a bump connection structure can be easily manufactured by using the temporary adhesive material layer in the present invention at least having a structure of two layers to bond the wafer to the support.

In addition, the present invention provides a wafer processing laminate comprising a temporary adhesive material layer formed on a support and a wafer laminated on the temporary adhesive material layer, the wafer having a circuit-forming front surface and a back surface to be processed, wherein the temporary adhesive material layer has a composite temporary adhesive material layer having a two-layer structure of a first temporary adhesive layer and a second temporary adhesive layer, the first temporary adhesive layer comprising a thermoplastic resin layer (A) that is releasably adhered to the front surface of the wafer; and the second temporary adhesive layer comprising a photo-curing siloxane polymer layer (B) laminated on the first temporary adhesive layer.

Such a wafer processing laminate allows temporary adhesion without heating and in a short time, so that the problem of wafer warpage on curing the temporary adhesive material is solved. In addition, bonding time can be shortened and delaminatability and cleaning removability are also excellent, so that productivity of thin wafers can be raised. Moreover, the wafer processing laminate has characteristics that it allows the formation of a layer with uniform film thickness on a heavily stepped substrate, is highly compatible with steps of forming a TSV and forming a wiring on the back surface of the wafer, and has excellent resistance to a thermal process such as CVD.

In this case, the photo-curing siloxane polymer layer (B) is preferably a cured layer of a photo-curing siloxane composition containing:

(B-1) an organopolysiloxane having two or more alkenyl groups in a molecule thereof;

(B-2) an organohydrogenpolysiloxane having two or more silicon atom-bonded hydrogen atoms (i.e. Si—H groups) per molecule in such an amount that a mole ratio of the Si—H groups in the component (B-2) to the alkenyl groups in the component (B-1) ranges from 0.3 to 10; and (B-3) 1 to 5,000 ppm of a photoactive hydrosilylation reaction catalyst based on a total mass of the component (B-1) and the component (B-2) in terms of an amount of metal atoms.

Such a wafer processing laminate is more excellent in CVD resistance.

Furthermore, in this case, the photo-curing siloxane composition preferably further contains a hydrosilylation reaction inhibitor as a component (B-4), and the component (B-3) is preferably contained in an amount of 1 to 5,000 ppm based on a total mass of the component (B-1), the component (B-2), and the component (B-4) in terms of an amount of metal atoms.

When such a wafer processing laminate is used, thickening viscosity and gelation of the solution to be treated (i.e. the photo-curing siloxane composition) hardly occur before curing.

Furthermore, in the photo-curing siloxane composition, the photoactive hydrosilylation reaction catalyst of the component (B-3) is preferably one or both of a ($\eta^5$-cyclopentadienyl)tri($\sigma$-alkyl)platinum(IV) complex and a $\beta$-diketonato platinum(II) complex.

In such a wafer processing laminate, the component (B-3) photoactive hydrosilylation reaction catalyst shows catalytic activity under UV light of UV-B to UV-A, so that damage to the wafer can be suppressed.

Furthermore, in the present invention, after the photo-curing siloxane polymer layer (B) is cured, a 180° peeling force against the thermoplastic resin layer (A) measured at 25° C. by using a test piece having a width of 25 mm is preferably 2 gf (0.0196 N) or more and 50 gf (0.490 N) or less.

When the wafer processing laminate has a photo-curing siloxane polymer layer (B) having such a peeling force, there is no risk of slippage of the wafer occurring when grinding the wafer, and delamination becomes easier.

Furthermore, in the present invention, after the photo-curing siloxane polymer layer (B) is cured, a storage modulus at 25° C. is preferably 1,000 Pa or more and 1,000 MPa or less.

When the wafer processing laminate is provided with a photo-curing siloxane polymer layer (B) having such a storage modulus, there is no risk of slippage of the wafer occurring during wafer grinding, and the laminate is also stable during thermal processing of the wafer.

Advantageous Effects of Invention

The temporary adhesive material layer in the present invention at least has a structure of two layers, and in particular, a photo-curing siloxane-modified resin (polymer layer (B)) is used as a temporary adhesive layer for bonding a substrate. Thus, substrate bonding can be performed without heating and in a short time, and as a result, wafer warpage at the time of bonding can be suppressed, and bonding time can also be shortened. In addition, after bonding, thermal decomposition of the resin does not occur as a matter of course, and flow of the resin at a high temperature of particularly 200° C. or higher also does not occur. Because of the excellent heat resistance, CVD resistance is also excellent, and the temporary adhesive material layer can be applied to a wide range of semiconductor film-forming processes. Furthermore, an adhesive material layer with a highly uniform thickness can be formed even on a stepped wafer. By virtue of the uniform thickness of the film, a uniform thin wafer of 50 μm or thinner can be easily manufactured. Moreover, after manufacturing a thin wafer, the wafer can be easily delaminated from the support, for example, at room temperature, so that a fragile thin wafer can be easily manufactured.

BRIEF DESCRIPTION OF DRAWINGS

FIG. 1 is a cross-sectional view of an exemplary wafer processing laminate of the present invention.

DESCRIPTION OF EMBODIMENTS

As described above, there has been demanded a temporary adhesive material for wafer processing which allows a bonding step to be performed without heating and in a short time to reduce wafer warpage during bonding and shorten bonding time, has excellent delaminatability and excellent cleaning removability after delamination, allows the formation of a layer with uniform film thickness on a heavily stepped substrate, is highly compatible with steps of forming a TSV and forming a wiring on the back surface of the wafer, and has excellent resistance to a thermal process for wafer such as CVD.

The present inventors have earnestly studied to accomplish the above objects and consequently found a temporary adhesive material for wafer processing that allows easy manufacturing of a thin wafer having a through electrode structure or a bump connection structure and found a method for manufacturing a thin wafer using the material by using a composite temporary adhesive material layer that at least has a system of two layers including (A) a thermoplastic temporary adhesive layer containing a thermoplastic resin and (B) a photo-curing temporary adhesive layer containing a photo-curing siloxane polymer for bonding the wafer to the support in a structure having (A) and (B) formed in this order from the wafer side.

Thus, the above-described problems can be solved.

That is, the present invention is a temporary adhesive material for wafer processing, the temporary adhesive material temporarily bonding a support to a wafer having a circuit-forming front surface and a back surface to be processed, including a composite temporary adhesive material layer at least having a two-layer structure of a first temporary adhesive layer and a second temporary adhesive layer, the first temporary adhesive layer including a thermoplastic resin layer (A) that can be releasably adhered to the front surface of the wafer; and the second temporary adhesive layer including a photo-curing siloxane polymer layer (B) laminated on the first temporary adhesive layer.

Hereinbelow, the present invention will be described in detail, but the present invention is not limited thereto.

Temporary Adhesive Material for Wafer Processing

The inventive temporary adhesive material for wafer processing temporarily bonds a support to a wafer having a circuit-forming front surface and a back surface to be processed. The material includes a composite temporary adhesive material layer at least having a structure of two layers of a first temporary adhesive layer and a second temporary adhesive layer. The first temporary adhesive layer includes a thermoplastic resin layer (A) that can be releasably adhered to the front surface of the wafer, and the second temporary adhesive layer includes a photo-curing siloxane polymer layer (B) laminated on the first temporary adhesive layer.

In the following, the temporary adhesive material for wafer processing will be described with reference to the drawing.

FIG. 1 is a cross-sectional view showing an example of the inventive wafer processing laminate. As shown in FIG. 1, the inventive wafer processing laminate has a wafer (device wafer) 1 having a circuit-forming front surface and a back surface to be processed, a support 3 for supporting the wafer 1 at the time of processing the wafer 1, and a temporary adhesive material layer 2 for intervening between the wafer 1 and the support 3. The temporary adhesive material layer 2 has a two-layer structure of a thermoplastic resin layer (A) (first temporary adhesive layer) and a photo-curing siloxane polymer layer (B) (second temporary adhesive layer). The first temporary adhesive layer is releasably adhered to the front surface of the wafer 1, and the second temporary adhesive layer is releasably adhered to the support 3.

As described, the inventive temporary adhesive material for wafer processing includes a laminate of the above-described (A) and (B).

The inventive temporary adhesive material for wafer processing can be cured without heating and in a short time, so that wafer warpage at the time of bonding can be improved, bonding time can be shortened, and the temporary adhesive material has excellent delaminatability and cleaning removability. Using this temporary adhesive material, it is possible to provide: a wafer processing laminate that allows the formation of a layer with uniform film thickness on a heavily stepped substrate, is highly compatible with steps of forming a TSV and forming a wiring on the back surface of the wafer, has excellent resistance to a thermal process for wafer such as CVD, facilitates delamination, and is capable of increasing productivity of thin wafers; and a method for manufacturing a thin wafer by using the above-described temporary adhesive material for wafer processing.

[Temporary Adhesive Material Layer]

—First Temporary Adhesive Layer/Thermoplastic Resin Layer (A) (Thermoplastic Polymer Layer)—

The first temporary adhesive layer is composed of a thermoplastic resin (A). In view of applicability to a stepped silicon wafer, etc., a thermoplastic resin having a good spin-coating property is suitably used as a material for forming the first temporary adhesive layer. In particular, a thermoplastic resin having a glass transition temperature of about −80 to 120° C. is preferable, and a non-silicone type thermoplastic resin is further preferable. Examples thereof include an olefin type thermoplastic elastomer, a polybutadiene type thermoplastic elastomer, a styrene type thermoplastic elastomer, a styrene/butadiene type thermoplastic elastomer, a styrene/polyolefin type thermoplastic elastomer, etc., in particular, a hydrogenated polystyrene type elastomer excellent in heat resistance is suitable. More specifically, there may be mentioned Tuftec (Asahi Kasei Chemicals Corporation), ESPOLEX SB type (Sumitomo Chemical Co., Ltd.), RABALON (Mitsubishi Chemical Corporation), SEPTON (Kuraray Co., Ltd.), DYNARON (JSR), etc. In addition, there may be mentioned a cycloolefin polymer represented by ZEONEX (ZEON Corporation) and a cyclic olefin copolymer represented by TOPAS (Nippon Polyplastics Co., Ltd.).

When the first temporary adhesive layer is constituted from a non-silicone type thermoplastic resin, it is possible to achieve excellent features such as the reduction of wafer warpage at the time of bonding, reduction in bonding time, excellent delaminatability into the substrate and the support, and cleaning removability from the substrate and the support.

As described above, the thermoplastic resin layer (A) is preferably a thermoplastic elastomer.

This enables a thin wafer to be easily delaminated from the support after manufacturing the wafer. Thus, a fragile thin wafer can be easily handled.

The thermoplastic resin layer is formed on a substrate such as a semiconductor substrate including a silicon wafer by dissolving the thermoplastic resin in a solvent and applying the solution on the substrate by means of spin-coating, spray-coating, or the like. Examples of the solvent include hydrocarbon solvents, preferably nonane, p-menthane, pinene, isooctane, etc. Nonane, p-menthane, and isooctane are more preferred because of their coating properties. The amount of solvent to be used for dilution can be appropriately adjusted depending on workability and the target film thickness, but is preferably blended in an amount of 100 to 2,000 parts by mass based on 100 parts by mass of the thermoplastic resin. The thickness of the film to be formed is not limited, but the resin film is desirably formed depending on the steps on the substrate, preferably with a film thickness of 0.5 μm to 50 μm, more preferably 0.5 to 10 μm. In addition, to the thermoplastic resin may be added an antioxidant for the purpose of improving heat resistance, or a surfactant for the purpose of improving coating property. Illustrative examples of the antioxidant that can be used include known antioxidants, and di-t-butylphenol, etc. can be suitably used. Examples of the usable surfactant include a fluorine-containing type surfactant, etc., and for example, X-70-1102 (available from Shin-Etsu Chemical Co., Ltd.), etc. can be suitably used.

—Second Temporary Adhesive Layer/Photo-Curing Siloxane Polymer Layer (B) (Photo-Curing Silicone Polymer Layer)—

The photo-curing siloxane polymer layer (B), which is a constitutional component of the inventive wafer processing laminate and temporary adhesive material for wafer processing is not particularly limited as long as it contains a photo-curing siloxane polymer. For example, the photo-curing siloxane polymer layer (B) is preferably a cured layer of a photo-curing siloxane composition containing the following components (B-1) to (B-3) and further containing the component (B-4) described below as necessary.

(B-1) An organopolysiloxane having two or more alkenyl groups in a molecule thereof;
(B-2) an organohydrogenpolysiloxane having two or more silicon atom-bonded hydrogen atoms (i.e. Si—H groups) per molecule in such an amount that a mole ratio of the Si—H groups in the component (B-2) to the alkenyl groups in the component (B-1) ranges from 0.3 to 10;
(B-3) a photoactive hydrosilylation reaction catalyst.

In this case, the photo-curing siloxane composition preferably further contains a reaction inhibitor as a component (B-4). The content of the reaction inhibitor is preferably 0.1 to 10 parts by mass based on a total of 100 parts by mass of the components (B-1) and (B-2).

In the following, each of the components constituting the photo-curing siloxane composition will be described.

[Component (B-1)]

The component (B-1) is an organopolysiloxane having two or more alkenyl groups in one molecule thereof. The component (B-1) is preferably a linear or branched diorganopolysiloxane containing two or more alkenyl groups in a molecule thereof. The component (B-1) is particularly preferably a diorganopolysiloxane containing 0.3 to 10 mol %, in particular, 0.6 mol % (mole of alkenyl group/mole of Si) to 9 mol % of alkenyl groups in a molecule. The organopolysiloxane may be a mixture of two or more kinds.

Specific examples of such a diorganopolysiloxane include compounds represented by the following formula (1) and/or (2).

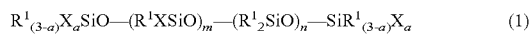

$$R^1{}_{(3-a)}X_aSiO—(R^1XSiO)_m—(R^1{}_2SiO)_n—SiR^1{}_{(3-a)}X_a \quad (1)$$

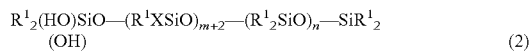

$$R^1{}_2(HO)SiO—(R^1XSiO)_{m+2}—(R^1{}_2SiO)_n—SiR^1{}_2(OH) \quad (2)$$

In the formulae, each $R^1$ independently represents a monovalent hydrocarbon group having no aliphatic unsaturated bond; each X independently represents a monovalent organic group having an alkenyl group; and "a" is an integer of 0 to 3. In the formula (1), 2a+m is such a number that the content of alkenyl groups is 0.3 to 10 mol % per molecule. In the formula (2), m+2 is such a number that the content of alkenyl groups is 0.3 to 10 mol % per molecule. "m" is 0 or a positive number of 10 or less, and "n" is a positive number of 1 to 1000.

In the above formulae, $R^1$ is preferably a monovalent hydrocarbon group having 1 to 10 carbon atoms. Examples thereof include alkyl groups such as a methyl group, an ethyl group, a propyl group, and a butyl group; cycloalkyl groups such as a cyclohexyl group; aryl groups such as a phenyl group and a tolyl group; and the like. In particular, alkyl groups such as a methyl group or a phenyl group is preferred. In the general formula (1) or (2), the $R^1$s may be independently identical or different substituents.

X, a monovalent organic group having an alkenyl group, is preferably an organic group having 2 to 10 carbon atoms. Examples thereof include alkenyl groups such as a vinyl group, an allyl group, a hexenyl group, and an octenyl group; (meth)acryloylalkyl groups such as an acryloylpropyl group, an acryloylmethyl group, and a methacryloylpropyl group; (meth)acryloxyalkyl groups such as an acryloxypropyl group, an acryloxymethyl group, a methacryloxypropyl group, and a methacryloxymethyl group; and alkenyl group-containing monovalent hydrocarbon groups such as a cyclohexenylethyl group and a vinyloxypropyl group. In particular, a vinyl group is industrially preferred.

In the general formula (1), "a" is an integer of 0 to 3, preferably 1 to 3. This range is preferable since terminals of the molecular chain are blocked with alkenyl groups, and thus the reaction can be completed within a short time by the alkenyl groups with a good reactivity at the terminals of the molecular chain. Further, a=1 is industrially preferred in view of the cost. This alkenyl group-containing diorganopolysiloxane is preferably in an oil state or a crude rubber state. The alkenyl group-containing diorganopolysiloxane may be linear or branched.

[Component (B-2)]

The component (B-2) is a crosslinking agent, and is an organohydrogenpolysiloxane having two or more silicon atom-bonded hydrogen atoms (i.e. Si—H groups) per molecule. The component (B-2) has at least two, preferably three or more silicon atom-bonded hydrogen atoms (i.e. SiH groups) per molecule, and a linear, branched, or cyclic organohydrogenpolysiloxane can be used.

The component (B-2) organohydrogenpolysiloxane preferably has a viscosity at 25° C. of 1 to 5,000 mPa·s, further preferably 5 to 500 mPa·s. The organohydrogenpolysiloxane may be a mixture of two or more kinds thereof. The viscosity can be measured by a method described in JIS K 7117-1: 1999.

The component (B-2) is preferably blended so that a mole ratio of the Si—H group in the component (B-2) to the alkenyl group in the component (B-1) (SiH group/alkenyl group) ranges from 0.3 to 10, particularly preferably 1.0 to 8.0. When the mole ratio of the SiH group to the alkenyl group is 0.3 or more, crosslinking density is not lowered, and problems such as the temporary adhesive material layer not curing do not occur either. When the mole ratio is 10 or less, crosslinking density is not too high, and sufficient adhesion and tackiness can be achieved. In addition, when the mole ratio is 10 or less, the available time of the solution to be treated can be lengthened.

[Component (B-3)]

The component (B-3) is a photoactive hydrosilylation reaction catalyst. This photoactive hydrosilylation reaction catalyst is a catalyst that is activated by irradiation with light, especially an ultraviolet ray having a wavelength of 300 to 400 nm, and promotes an addition reaction between alkenyl groups in the component (B-1) and Si—H groups in the component (B-2). This promoting effect has temperature dependence, and the higher the temperature, the higher the promoting effect. Therefore, the catalyst is preferably used under an environment of 0 to 200° C., more preferably 10 to 100° C. after the irradiation with light in view of completing the reaction within an appropriate reaction time.

A platinum group-based metal catalyst or an iron group-based metal catalyst are mainly applicable as the photoactive hydrosilylation reaction catalyst. Examples of the platinum group-based metal catalyst include platinum-based, palladium-based, and rhodium-based metal complexes, and examples of the iron group-based metal catalyst include nickel-based, iron-based, and cobalt-based iron group complexes. In particular, platinum-based metal complexes are preferable since they are comparatively easily obtained and exhibit excellent catalytic activity, and are often used.

As a ligand, one that shows catalytic activity under UV light having a medium to long wavelength of UV-B to UV-A is preferable in view of suppressing damage to the wafer. Examples of such ligands include a cyclic diene ligand and a β-diketonato ligand.

From the above, preferable examples of the photoactive hydrosilylation reaction catalyst include: as cyclic diene ligand types, ($\eta^5$-cyclopentadienyl)tri(σ-alkyl)platinum(IV) complexes, specifically, (methylcyclopentadienyl)trimethylplatinum(IV), (cyclopentadienyl)trimethylplatinum(IV), (1,2,3,4,5-pentamethylcyclopentadienyl) trimethylplatinum (IV), (cyclopentadienyl)dimethylethylplatinum(IV), (cyclopentadienyl)dimethylacetylplatinum(IV), (trimethylsilylcyclopentadienyl)trimethylplatinum(IV), (methoxycarbonylcyclopentadienyl)trimethylplatinum(IV), and (dimethylphenylsilylcyclopentadienyl)trimethylplatinum(IV); and as β-diketonato ligand types, β-diketonato platinum(II) or platinum(IV) complexes, specifically, trimethyl (acetylacetonato)platinum(IV), trimethyl(3,5-heptanedionate)platinum(IV), trimethyl (methylacetoacetate)platinum(IV), bis(2,4-pentanedionato) platinum(II), bis(2,4-hexanedionato)platinum(II), bis(2,4-heptanedionato)platinum(II), bis(3,5-heptanedionato) platinum(II), bis(1-phenyl-1,3-butanedionato)platinum(II), bis(1,3-diphenyl-1,3-propanedionato)platinum(II), and bis (hexafluoroacetylacetonato)platinum(II).

When using these catalysts, the catalyst may be used in a solid state when it is a solid catalyst. However, to obtain a more uniform cured material, the catalyst is preferably dissolved in an appropriate solvent, made compatible with the organopolysiloxane of the component (B-1) having alkenyl groups, and used.

Examples of the solvent include isononane, toluene, 2-(2-butoxyethoxy)ethyl acetate, etc.

The amount of the component (B-3) to be added can be an effective amount. Generally, the amount is 1 to 5,000 ppm, preferably 5 to 2,000 ppm in terms of (an amount of metal atoms of) platinum based on a total mass of (B-1) and (B-2) (when a later-described component (B-4) is contained, a total mass of (B-1), (B-2), and (B-4)). When the added amount is 1 ppm or more, curability of the composition is not lowered, and crosslinking density and holding force are also not lowered. When the amount is 0.5% or less, there is no risk of the storage stability or available time of the composition becoming extremely short.

[Component (B-4)]

The component (B-4) is a reaction inhibitor. It is optionally added as necessary when the composition is prepared or applied to the substrate in order to prevent thickening viscosity and gelation of the solution to be treated (photo-curing siloxane composition) before curing.

Illustrative examples thereof include 3-methyl-1-butyn-3-ol, 3-methyl-1-pentyne-3-ol, 3,5-dimethyl-1-hexyne-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne, 1-ethynyl-1-trimethylsiloxycyclohexane, bis(2,2-dimethyl-3-butynoxy) dimethylsilane, 1,3,5,7-tetramethyl-1,3,5,7-tetravinylcyclotetrasiloxane, 1,1,3,3-tetramethyl-1,3-divinyldisiloxane, etc.; and 1-ethynylcyclohexanol and 3-methyl-1-butyn-3-ol are preferred.

When the component (B-4) is contained in the composition, the control ability of the component (B-4) varies depending on its chemical structure. Therefore the contained amount of the component (B-4) should be adjusted to the optimum amount. However, generally, there is a possibility that if the contained amount of the inhibitor is too small, long-term storage stability at room temperature cannot be achieved, and if the contained amount is too large, curability is degraded and sufficient curability cannot be achieved.

[Other Components]

The following components can be further added to the photo-curing siloxane composition as necessary.

(Polyorganosiloxane)

A polyorganosiloxane may be added to the photo-curing siloxane composition, the polyorganosiloxane containing an $R^2_3SiO_{0.5}$ unit (in the formula, $R^2$ is independently an unsubstituted or substituted monovalent hydrocarbon group having 1 to 10 carbon atoms) and an $SiO_2$ unit, where the mole ratio of $R^2_3SiO_{0.5}$ unit/$SiO_2$ unit is 0.3 to 1.8. The added amount is preferably 0 to 30 mass % of the component (B-1) in the photo-curing siloxane polymer layer (B).

(Solvent)

The photo-curing siloxane composition may be subjected to a process of preparing a solution with a soluble solvent, removing the solvent in a prebaking step before bonding, and then bonding in order to improve the workability and mixing property of the composition by lowering the viscosity, to adjust the film thickness of the polymer layer (B), and so forth. The solvent used here is not particularly limited as long as the composition is soluble and the solvent can be removed by heating in the prebaking step. For example, a hydrocarbon-based solvent such as pentane, hexane, cyclohexane, isooctane, nonane, decane, p-menthane, pinene, isododecane, and limonene is suitably used.

As methods for preparing the solution, the following are possible: after preparing the photo-curing siloxane composition, the solvent may be added at the end to adjust the viscosity to a desired level; or the (B-1) and/or (B-2), having high viscosities, may be diluted with a solvent beforehand to improve workability and mixing property, and then the rest of the components may be mixed in so as to prepare a photo-curing siloxane polymer layer (B) composition. The mixing means on preparing the solution may be selected and performed appropriately depending on the viscosity and workability of the composition. Examples include a shake-mixer, a magnetic stirrer, various mixers, etc.

The amount of the solvent to be blended can be appropriately set depending on the viscosity and workability of the composition, adjustment of the film thickness of the photo-curing siloxane polymer layer (B), etc. For example, the amount can be 10 to 900 parts by mass, preferably 20 to 400 parts by mass based on 100 parts by mass of the photo-curing siloxane polymer layer (B) composition.

[Method for Forming Photo-Curing Siloxane Polymer Layer (B), Etc.]

The photo-curing siloxane polymer layer (B) can be used by applying a photo-curing siloxane composition or a solution thereof on the support by a method such as spin-coating and roll coater. In particular, when the photo-curing siloxane polymer layer (B) is formed on the support by a method such as spin-coating, it is preferred to apply a solution for the polymer layer (B).

In addition, a known antioxidant can be added to the solution to improve heat resistance.

Furthermore, the photo-curing siloxane polymer layer (B) is preferably formed with a film thickness of 0.1 to 30 μm, preferably 1.0 to 15 μm and used. When the film thickness is 0.1 μm or more, the entire support can be coated without portions that cannot be completely coated when the support is coated. Meanwhile, when the film thickness is 30 μm or less, the layer can withstand the grinding step when forming a thin wafer. Incidentally, a filler such as silica may be added to the photo-curing siloxane polymer layer (B) as necessary in order to raise heat resistance further.

Furthermore, after curing, a 180° peeling force of the photo-curing siloxane polymer layer (B) against the thermoplastic resin layer (A) measured at 25° C. by using a test piece (e.g., a polyimide test piece) having a width of 25 mm is usually 2 gf (0.0196 N) or more and 50 gf (0.490 N) or less, preferably 3 gf (0.0294 N) or more and 30 gf (0.294 N) or less, further preferably 5 gf (0.0490 N) or more and 20 gf (0.196 N) or less. When the 180° peeling force is 2 gf or more, there is no risk of the slippage of the wafer during wafer grinding, and when the 180° peeling force is 50 gf or less, the wafer can be delaminated easily. Therefore, this range is preferred.

Note that the 180° peeling force is determined in the following manner: five polyimide tapes with a length of 150 mm and a width of 25 mm are attached to the layer to be tested (for example, the cured layer on the wafer), and unnecessary parts of the layer to which no tape has been attached are removed. For example, by using AUTOGRAPH (AG-1) manufactured by Shimadzu Co., 120 mm of the tapes are peeled off from one end thereof by 180° peeling at a speed of 300 mm/minute at 25° C., and an average force applied at that time (120 mm stroke×5 times) is measured as a 180° peeling force of the layer to be tested.

Furthermore, after curing, the photo-curing siloxane polymer layer (B) has a storage modulus at 25° C. of 1,000 Pa or more and 1000 MPa or less, preferably 10,000 Pa or more and 500 MPa or less, and further preferably 100 kPa to 300 MPa. When the storage modulus is 1,000 Pa or more, the strength of the formed film is sufficient, so that there is no risk of slippage of the wafer during wafer grinding or accompanying wafer-cracking. When the storage modulus is 1000 MPa or less, deforming stress during a wafer thermal process such as CVD can be relieved, so that there is no risk of the wafer cracking.

Note that the storage modulus can be measured by using a viscoelasticity measuring apparatus that can measure shear modulus (for example, ARES-G2 manufactured by TA Instruments Company). The measurement is carried out as follows: while sandwiching the substrate including the layer to be tested with plates by using a viscoelasticity measuring apparatus so that a predetermined load (for example, 50 gf) is applied to the layer to be tested, the modulus at 25° C. is measured; and the obtained value of the storage modulus is taken as the film modulus of the layer to be tested.

[Method for Manufacturing Thin Wafer]

The inventive method for manufacturing a thin wafer is characterized by using the composite temporary adhesive material layer including the two layers which are the thermoplastic resin layer (A) and the photo-curing siloxane polymer layer (B) as the layer for bonding the support to the wafer having a semiconductor circuit, etc., and two embodiments will be shown here. In both embodiments, the thickness of a thin wafer obtained by the manufacturing method of the present invention is typically 5 to 300 μm, more typically 10 to 100 μm.

As a first embodiment, the inventive method for manufacturing a thin wafer has the following steps of (a1) to (e). In addition, the method has the steps of (f) to (i) as necessary.

[Step (a1)]

Step (a1) is a step of bonding a support to a circuit-forming front surface of a wafer having the circuit-forming front surface and a non-circuit-forming back surface through a temporary adhesive material layer having the thermoplastic resin layer (A) and the photo-curing siloxane polymer layer (B) to be used for the inventive temporary adhesive material for wafer processing by forming the photo-curing siloxane polymer layer (B) on the support and bonding the support having the polymer layer (B) formed to the wafer having a circuit and having the thermoplastic resin layer (A) formed under vacuum.

The wafer that has a circuit-forming front surface and a non-circuit-forming back surface is a wafer one of the surfaces of which is a circuit-forming surface, and the other surface of which is a non-circuit-forming surface. The wafer to which the present invention can be applied is generally a semiconductor wafer. Examples of the semiconductor wafer include not only a silicon wafer, but also a germanium wafer, a gallium-arsenic wafer, a gallium-phosphorus wafer, a gallium-arsenic-aluminum wafer, etc. The thickness of the wafer is not particularly limited, but typically 600 to 800 μm, more typically 625 to 775 μm.

In the first embodiment of the present invention, the light irradiation of the photo-curing siloxane polymer layer (B) is performed through the support. Therefore, as the support, it is possible to use a light transmittable substrate such as a glass plate, a quartz plate, an acrylic plate, a polycarbonate plate, and a polyethylene terephthalate plate. In particular, a glass plate is preferable since it can transmit ultraviolet rays and has excellent heat resistance.

The temporary adhesive layers (A) and (B) may each be formed on the wafer or support as a film. Alternatively, a composition that gives the respective layers or a solution of the composition can be formed on the wafer or support by a method such as spin-coating or roll coater. When the composition is used as a solution, prebaking is performed beforehand at a temperature of 20 to 200° C., preferably 30 to 150° C. in accordance with the volatilization conditions of the solvent after spin-coating, and then the resulting layers are put to use.

The wafer and the support having the temporary adhesive layers (A) and (B) formed are formed as a substrate bonded through the layers (A) and (B). In this event, this substrate is preferably pressed uniformly in a temperature range of 0 to 200° C., more preferably 10 to 100° C. under reduced pressure to form a wafer processing laminate (laminated substrate) having the wafer and the support bonded.

Examples of an apparatus for bonding the wafer include commercially available wafer-bonding apparatuses such as EVG520IS and 850TB manufactured by EVG Group and XBS300 manufactured by SUSS MicroTec AG.

[Step (b1)]

Step (b1) is a step of photo-curing the photo-curing siloxane polymer layer (B). After the wafer processing laminate (laminated substrate) has been formed, light irradiation is performed from the side of the light transmittable support to photo-cure the polymer layer (B). The kind of the active light used on this occasion is not particularly limited, but an ultraviolet ray is preferable, and an ultraviolet ray having a wavelength of 300-400 nm is further preferable. The irradiation quantity (illuminance) of the ultraviolet ray is desirably 100 mJ/cm$^2$ to 100,000 mJ/cm$^2$, preferably 500 mJ/cm$^2$ to 10,000 mJ/cm$^2$, more preferably 1,000 to 5,000 mJ/cm$^2$ as the total quantity of light in view of achieving excellent curability. When the irradiation quantity (illuminance) of the ultraviolet ray is the above-described limit or more, it is possible to achieve sufficient energy for activating the photoactive hydrosilylation reaction catalyst in the polymer layer (B) and sufficient cured material. Meanwhile, when the irradiation quantity (illuminance) of the ultraviolet ray is the above-described limit or less, the composition can be irradiated with sufficient energy, and sufficient cured material can be obtained without the components of the polymer layer decomposing or a part of the catalyst being deactivated.

The ultraviolet ray irradiation may be with a light having a plurality of emission spectra or a light having a single emission spectrum. The single emission spectrum may have a broad spectrum in a range of 300 nm to 400 nm. The light having a single emission spectrum has a peak (that is, the maximum peak wavelength) in the range of 300 nm to 400 nm, preferably 350 nm to 380 nm. Examples of light sources for irradiation with such light include ultraviolet light-emitting semiconductor device light sources such as ultraviolet light-emitting diodes (ultraviolet LEDs) and ultraviolet light-emitting semiconductor lasers.

Examples of light sources for irradiation with light having a plurality of emission spectra include lamps such as metal halide lamps, xenon lamps, carbon arc lamps, chemical lamps, sodium lamps, low-pressure mercury lamps, high-pressure mercury lamps, and ultra-high-pressure mercury lamps, gas lasers of nitrogen or the like, liquid lasers of organic dye solutions, solid-state lasers having an inorganic single crystal containing rare earth ions, etc.

When the light has a peak in a wavelength range of shorter than 300 nm in the emission spectrum, or when there is a wavelength having an irradiance greater than 5% of the irradiance of the maximum peak wavelength of the emission spectrum in the wavelength range of shorter than 300 nm (for example, when the emission spectrum is broad over a wide wavelength range), and a substrate, such as a quartz wafer, that can also transmit light with a wavelength of shorter than 300 nm is used as the support, it is preferable to remove light having a wavelength in a wavelength range of shorter than 300 nm by using an optical filter in order to obtain sufficient cured material. Accordingly, the irradiance of each wavelength in the wavelength range of shorter than 300 nm is set to 5% or less, preferably 1% or less, more preferably 0.1% or less, and further preferably 0% of the irradiance of the maximum peak wavelength. Note that when there is a plurality of peaks in the wavelength range of 300 nm to 400 nm in the emission spectrum, the peak wavelength that shows the greatest absorbance among the peaks is taken as the maximum peak wavelength. The optical filter is not particularly limited as long as it eliminates wavelengths shorter than 300 nm, and a known optical filter can be used. For example, a 365-nm bandpass filter or the like can be used. Incidentally, the illuminance and spectral distribution of the ultraviolet ray can be measured with a spectroradiometer, for example, USR-45D (Ushio Inc.).

Light irradiation apparatuses are not particularly limited, but for example, irradiation apparatuses such as a spot type irradiation apparatus, a plane type irradiation apparatus, a line type irradiation apparatus, and a conveyor type irradiation apparatus can be used.

When curing the photo-curing siloxane polymer layer (B) of the present invention, the time of irradiation with light also depends on illuminance, and therefore cannot be generally defined. However, when the illuminance is adjusted so that the irradiation time is, for example, 1 to 300 seconds, preferably 10 to 200 seconds, and more preferably 20 to 150 seconds, the irradiation time can be made appropriately short, and no problems arise in operation steps. In addition, the photo-curing siloxane polymer layer (B) subjected to irradiation with light undergoes gelation in 1 to 120 minutes, in particular, 5 to 60 minutes after the irradiation. Note that in the present invention, "gelation" indicates a state in which the curing reaction of the photo-curing siloxane polymer layer (B) has partially progressed and the composition has lost flowability.

In addition, the wafer processing laminate (laminated substrate) subjected to irradiation with light may be subjected to an additional heat treatment step in a temperature region of 40 to 200° C., preferably 40 to 100° C. In this manner, curing of the photo-curing siloxane polymer layer after the irradiation with light can be promoted, and the curing reaction can be completed in a shorter time. The time of the additional heat treatment can be appropriately set since the time also depends on the temperature, but is preferably 10 seconds to 60 minutes, more preferably 1 minute to 30 minutes. When the temperature is set to a high temperature, the curing is completed quickly, so that the step can be shortened. However, if the temperature is too high, wafer warpage may occur.

[Step (c)]

Step (c) is a step of grinding or polishing the non-circuit-forming back surface of the wafer bonded to the support, in other words, a step of grinding the wafer processing laminate obtained by bonding through the steps (a1) and (b1) from the wafer back surface side to reduce the thickness of the wafer. The technique for grinding the wafer back surface is not particularly limited, and conventionally known grinding techniques may be adopted. The grinding is preferably performed while feeding water to the wafer and a grinding wheel (e.g. diamond) for cooling. Examples of an apparatus for grinding the wafer back surface include DAG-810 (trade name) manufactured by DISCO Co., Ltd. Also, the wafer back surface side may be subjected to CMP polishing.

[Step (d)]

Step (d) is a step of processing the non-circuit-forming surface of the wafer processing laminate which has been ground, i.e., the non-circuit-forming surface of the wafer processing laminate which has been thinned by grinding the back surface. This step includes various processes applied in the wafer level, for example, electrode formation, metal wiring formation, protective film formation, etc. More specifically, there may be mentioned well-known processes such as metal sputtering for forming electrodes and so on, wet etching for etching a sputtered metal layer, patterning process in which a resist is applied and subjected to exposure and development to form a pattern used as a mask for metal wiring formation, resist removal, dry etching, formation of a metal plating, silicon etching to form a TSV, and formation of an oxide film on silicon surface.

[Step (e)]

Step (e) is a step of delaminating the wafer processed in the step (d) from the support, in other words, a step of delaminating the wafer before dicing from the support after the thinned wafer is subjected to various processes. Examples of this delamination step include: a method in which either of the wafer or the support of the wafer processing laminate is horizontally fixed, heated at about 100° C. as necessary, and the other is peeled at a certain angle with respect to the horizontal direction; a method in which the wafer processing laminate is immersed in a solvent beforehand to make the temporary adhesive material layer swell, and then the wafer processing laminate is subjected to peeling delamination in the same manner as described above; a method in which a protective film is adhered to the ground surface of the wafer, and then the wafer and the protective film are peeled; a method in which either of the wafer or the support of the wafer processing laminate is horizontally fixed, heated at about 100° C., and the other is made to slide using the plasticity of the thermoplastic resin layer (A); and the like.

To the present invention, any of these delaminating methods can be applied, and the methods are, as a matter of course, not limited to those described above.

Furthermore, the step (e) of delaminating the processed wafer from the support particularly preferably includes the following steps for reasons such as facilitating the delamination of the support from the processed wafer, reducing damage to the wafer on delamination, and allowing easy progress to the dicing step after the delamination.

(f) A step of adhering a dicing tape to the wafer surface of the processed wafer
(g) A step of attaching the dicing tape surface by vacuum suction to a suction surface
(h) A step of delaminating the support from the processed wafer by peeling off with the temperature of the suction surface in the range of 10° C. to 100° C.

In addition, after the step (e) of delaminating the processed wafer from the support, it is preferable to perform
(i) a step of removing the temporary adhesive material layer remaining on the circuit-forming front surface of the delaminated wafer.

The temporary adhesive layer (A) sometimes partially remains on the circuit-forming front surface of the wafer that has been delaminated from the support in the step (e). The temporary adhesive layer (A) can be removed by, for example, cleaning the wafer.

In the step (i), any cleaning solution capable of dissolving the thermoplastic resin layer constituting the layer (A) in the temporary adhesive material layer can be used. Illustrative examples thereof include pentane, hexane, cyclohexane, decane, isononane, p-menthane, pinene, isododecane, and limonene. One of these solvents may be used or a combination of two or more kinds thereof may be used. If removal is difficult, a base or an acid may be added to the solvent. Examples of the usable base include amines such as ethanolamine, diethanolamine, triethanolamine, triethylamine, and ammonia; and ammonium salts such as tetramethylammonium hydroxide. Examples of the usable acid include organic acids such as acetic acid, oxalic acid, benzenesulfonic acid, and dodecylbenzenesulfonic acid. The amount thereof is 0.01 to 10 mass %, preferably 0.1 to 5 mass % in terms of concentration in the cleaning solution. To improve removal efficiency of the residual matters, an existing surfactant may be added thereto. Cleaning may be performed by paddling, spraying, or dipping in a cleaner tank with the above solution. The temperature is preferably 10 to 80° C., more preferably 15 to 65° C. If necessary, after dissolving the layer (A) in the dissolving solution, the wafer may be finally rinsed with water or an alcohol and then dried to obtain a thin wafer.

As a second embodiment of the inventive method for manufacturing a thin wafer, the following steps (a2) and (b2) will be shown. The steps after (b2), that is, steps (c) to (e), preferably (c) to (h) or (c) to (i) are the same as in the above-described first embodiment.

[Step (a2)]

Step (a2) is a step of forming a thermoplastic resin layer (A) on a wafer having a circuit and forming on a support a photo-curing siloxane polymer layer (B) that is subjected to irradiation with light.

Unlike the first embodiment, in which the irradiation with light is performed after bonding the wafer to the support, the photo-curing siloxane polymer layer (B) composition is irradiated with light before bonding. Therefore, the step of irradiating with light through the support is unnecessary, and as a result, the support does not need to be able to transmit light. Thus, according to this embodiment, substrates that do not transmit light such as silicon, aluminum, SUS (Stainless Used Steel), copper, germanium, gallium-arsenic, gallium-phosphorus, and gallium-arsenic-aluminum can also be used as a support in addition to the above-described supports.

Examples of the method for irradiating the photo-curing siloxane polymer layer (B) composition with light before bonding include: a method of applying the composition to the support while irradiating the composition with light; a method of irradiating the entire composition with light, and then coating the support with the resulting composition; a method of applying the composition to the support, and then performing the irradiation with light; and the like. However, the method is not particularly limited, and can be appropriately selected and performed considering workability. Regarding the type of the active light, ultraviolet ray irradiation quantity (illuminance), light source, emission spectrum, light irradiation apparatus, and time of irradiation with light in the irradiation with light, the methods given in [Step (b1)] of the first embodiment can be employed.

Methods for forming the first and second temporary adhesive layers can be performed in the same manner as the first embodiment, and the layers can be respectively formed on the wafer and the support by using a film or by methods such as spin-coating and roll coater by using a corresponding composition or a solution thereof. When the composition is used as a solution, prebaking is performed beforehand at a temperature of 20 to 200° C., preferably 30 to 150° C. in accordance with the volatilization conditions of the solvent after spin-coating, and then the resulting layers are put to use.

[Step (b2)]

Step (b2) is a step of bonding under vacuum the wafer having a circuit and having the thermoplastic resin layer (A) formed in the step (a2) to the support having the photo-curing siloxane polymer layer (B) formed. In this event, this substrate is preferably pressed uniformly in a temperature region of 0 to 200° C., more preferably 20 to 100° C. under reduced pressure (vacuum) to form a wafer processing laminate (laminated substrate) having the wafer and the support bonded.

As the apparatus for bonding the wafer, it is possible to use one the same as in the first embodiment.

After forming the wafer processing laminate (laminated substrate), it is possible to provide a step of an additional heat treatment in a temperature region of 40 to 200° C., preferably 40 to 100° C. for 10 seconds to 60 minutes, more preferably 1 minute to 30 minutes to promote the curing in the same manner as the step (b1).

EXAMPLE

Hereinafter, the present invention will be more specifically described with reference to Examples and Comparative Examples. However, the present invention is not limited to these Examples.

Resin Solution Preparation Example 1

24 g of a hydrogenated polystyrene type thermoplastic resin, SEPTON 4033 (available from KURARAY CO., LTD.) was dissolved in 176 g of isononane to obtain an isononane solution containing 12 mass % of SEPTON 4033. The obtained solution was filtered through a 0.2-μm membrane filter to obtain an isononane solution of the thermoplastic resin (A-1).

Resin Solution Preparation Example 2

To a solution consisting of 80 parts by mass of polydimethylsiloxane in which 0.5 mol % (mole of alkenyl group/mole of Si) of vinyl group is contained at molecular side chains and number-average molecular weight (Mn) is 30,000, and 400 parts by mass of isododecane, were added 3.0 parts by mass of organohydrogenpolysiloxane represented by the following formula (M-6) and 0.3 parts by mass of an isononane solution of ethynylcyclohexanol (1.0 mass %), and then mixed. Further, 0.5 parts by mass of a photoactive hydrosilylation reaction catalyst, an isononane solution of (methylcyclopentadienyl)trimethylplatinum(IV) (platinum concentration: 1.0 mass %) was added thereto, and the mixture was filtered through a 0.2-μm membrane filter to obtain a photo-curing siloxane polymer solution (B-a).

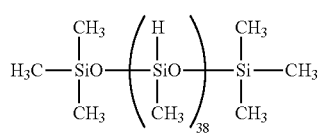

(M-6)

Resin Solution Preparation Example 3

To a solution consisting of 60 parts by mass of polydimethylsiloxane in which 0.5 mol % of vinyl group is contained at molecular side chains and number-average molecular weight (Mn) is 30,000, 20 parts by mass of polydimethylsiloxane in which 0.15 mol % of vinyl group is contained at both terminal chains and number-average molecular weight (Mn) is 60,000, and 400 parts by mass of isododecane, were added 2.5 parts by mass of organohydrogenpolysiloxane represented by (M-6) and 0.3 parts by mass of an isononane solution of ethynylcyclohexanol (1.0 mass %), and then mixed. Further, 0.5 parts by mass of a photoactive hydrosilylation reaction catalyst, an isononane solution of (methylcyclopentadienyl)trimethylplatinum(IV) (platinum concentration: 1.0 mass %) was added thereto, and the mixture was filtered through a 0.2-μm membrane filter to obtain a photo-curing siloxane polymer solution (B-b).

Resin Solution Preparation Example 4

To a solution consisting of 80 parts by mass of polydimethylsiloxane in which 5 mol % of vinyl group is contained at both terminals and side chain and number-average molecular weight (Mn) is 30,000, and 400 parts by mass of isododecane, were added 7.5 parts by mass of organohydrogenpolysiloxane represented by (M-6) and 0.3 parts by mass of an isononane solution of ethynylcyclohexanol (1.0 mass %), and then mixed. Further, 0.5 parts by mass of a photoactive hydrosilylation reaction catalyst, an isononane solution of (methylcyclopentadienyl)trimethylplatinum(IV) (platinum concentration: 1.0 mass %) was added thereto, and the mixture was filtered through a 0.2-μm membrane filter to obtain a photo-curing siloxane polymer solution (B-c).

Resin Solution Preparation Example 5

To a solution consisting of 80 parts by mass of polydimethylsiloxane in which 0.5 mol % of vinyl group is contained at molecular side chains and number-average molecular weight (Mn) is 30,000, and 400 parts by mass of isododecane, were added 3.0 parts by mass of organohydrogenpolysiloxane represented by (M-6) and 0.3 parts by mass of an isononane solution of ethynylcyclohexanol (1.0 mass %), and then mixed. Further, 1.0 part by mass of a photoactive hydrosilylation reaction catalyst, a 2-(2-butoxyethoxy)ethyl acetate solution of bis(2,4-heptanedionato)platinum(II) (platinum concentration: 0.5 mass %) was added thereto, and the mixture was filtered through a 0.2-μm membrane filter to obtain a photo-curing siloxane polymer solution (B-d).

Resin Solution Preparation Example 6

To a solution consisting of 80 parts by mass of polydimethylsiloxane in which 0.5 mol % of vinyl group is contained at molecular side chains and number-average molecular weight (Mn) is 30,000, and 400 parts by mass of isododecane, were added 3.0 parts by mass of organohydrogenpolysiloxane represented by (M-6) and 0.7 parts by mass of ethynylcyclohexanol, and then mixed. Further, 0.5 parts by mass of a platinum catalyst, PL-5 (available from Shin-Etsu Chemical Co., Ltd., platinum concentration: 1.0 mass %) was added thereto, and the mixture was filtered through a 0.2-μm membrane filter to obtain a thermosetting siloxane polymer solution (B-e).

The composition and so forth of the thermoplastic resin solutions and thermosetting siloxane polymer solutions are shown in Tables 1 and 2.

TABLE 1

|  | A-1 |
|---|---|
| SEPTON 4033 | 24 |
| Isononane | 176 |

TABLE 2

|  | B-a | B-b | B-c | B-d | B-e |
|---|---|---|---|---|---|
| Vinyl group-containing polydimethylsiloxane 1 | 80 | 60 | 80 | 80 | 80 |
| Vinyl group content (mol %) | 0.5 | 0.5 | 5.0 | 0.5 | 0.5 |
| Number-average molecular weight | 30,000 | 30,000 | 30,000 | 30,000 | 30,000 |
| Vinyl group-containing polydimethylsiloxane 2 | — | 20 | — | — | — |
| Vinyl group content (mol %) | — | 0.15 | — | — | — |
| Number-average molecular weight | — | 60,000 | — | — | — |
| Isododecane | 400 | 400 | 400 | 400 | 400 |

TABLE 2-continued

|  | B-a | B-b | B-c | B-d | B-e |
|---|---|---|---|---|---|
| Organohydrogensiloxane (M-6) | 3.0 | 2.5 | 7.5 | 3.0 | 3.0 |
| Ethynylcyclohexanol solution | 0.3 | 0.3 | 0.3 | 0.3 | 0.7 |
| (Methylcyclopentadienyl) trimethylplatinum(IV) solution | 0.5 | 0.5 | 0.5 | — | — |
| Bis(2,4-heptanedionato) platinum(II) solution | — | — | — | 1.0 | — |
| PL-5 | — | — | — | — | 0.5 |

Note that the number-average molecular weight is a result measured by gel permeation chromatography (GPC), by using toluene as an eluent and using a calibration curve with standard polystyrene.

Examples 1 to 7 and Comparative Examples 1 to 4

Onto a silicon wafer having a diameter of 200 mm (thickness: 725 μm) whose entire surface was formed with copper posts having a height of 10 μm and diameter of 40 μm, the material (A-1), corresponding to the layer (A), was applied by spin-coating, and then heated on a hot plate at 150° C. for 5 minutes to form the layer (A) having a film thickness shown in Table 3 on the bump-formed surface of the wafer. Meanwhile, a glass plate having a diameter of 200 mm (thickness: 500 μm) was used as a support, and onto this support was applied the solution of the photo-curing siloxane composition corresponding to the layer (B) by spin-coating, and then this was heated at 70° C. for 2 minutes on a hot plate to form the layer (B) having a film thickness shown in Table 3 on the support. The silicon wafer having the thermoplastic resin layer (A) and the glass plate having the photo-curing siloxane polymer layer (B) fabricated in this manner were vacuum bonded to each other so that the respective resin surfaces faced each other by using a wafer bonding apparatus EVG520IS manufactured by EVG Group at 25° C. under $10^{-3}$ mbar or less and a load of 5 kN. After that, the photo-curing siloxane polymer layer (B) was irradiated with light at room temperature by using a plane-irradiation type UV-LED (wavelength: 365 nm) irradiator under the conditions shown in Table 3 to fabricate a wafer processing laminate.

The wafer processing was evaluated by the various tests described below. The results are shown in Table 3.

—Observation Test of Wafer Warpage—

In the fabrication of the wafer processing laminate, the wafer warpage state at the time of the curing of the layer (B) was observed visually. When there was no warpage at all, the laminate was evaluated as "good", and when warpage had occurred, the laminate was evaluated as "poor".

—Adhesiveness Test—

A sample of the wafer processing laminate was heated at 180° C. for 1 hour by using an oven, cooled to room temperature, and then visually observed for the adhesion state of the wafer interface. When no abnormality such as bubbles were found at the interface, the sample was evaluated as good and shown with "good". When an abnormality was found, the sample was evaluated as poor and shown with "poor".

—Back Surface Grinding Resistance Test—

Regarding the samples of the wafer processing laminates in which warpage did not occur, the back surface of the silicon wafer was ground with a grinder (DAG810 manufactured by DISCO Co., Ltd.) using a diamond grinding wheel. After the wafer was ground to a final substrate thickness of 50 μm, abnormalities such as crack and peeling were checked with an optical microscope (100-folds). When no abnormality was found, the sample was evaluated as good and shown with "good", and when an abnormality was found, the sample was evaluated as poor and shown with "poor".

—CVD Resistance Test—

After the back surface of the silicon wafer had been ground, the laminate was put into a CVD apparatus, and subjected to a test of forming an $SiO_2$ film 2 μm thick to check abnormalities in appearance at that time by visual observation. When no appearance abnormality was found, the sample was evaluated as good and shown with "good". When appearance abnormalities such as voids, swelling of the wafer, and breakage of the wafer were found, the sample was evaluated as poor and shown with "poor". The conditions of the CVD resistance test are as follows.

Apparatus: Plasma CVD PD270STL (manufactured by SAMCO Inc.)

RF: 500 W, internal pressure: 40 Pa

TEOS (tetraethyl orthosilicate):$O_2$=20 sccm:680 sccm

—Delaminatability Test—

Regarding delaminatability of the substrate, first, a dicing tape was attached onto the wafer side of the wafer processing laminate that had been thinned to have a wafer thickness of 50 μm after subjected to the CVD resistance test, by using a dicing frame. This dicing tape surface was set to a suction plate by vacuum suction. Then, one point of the glass was lifted by tweezers at room temperature to delaminate the glass substrate. When the glass substrate was successfully delaminated without cracking the 50-μm thick wafer, the sample was shown with "good", and when abnormalities such as cracking occurred, the sample was evaluated as poor, and shown with "poor".

—Cleaning Removability Test—

After the delaminatability test, the wafer having the diameter of 200 mm (the wafer that has been subjected to the CVD resistance test conditions), attached to the dicing frame via the dicing tape, was set in a spin-coater with the adhesive layer on top. As a cleaning solvent, p-menthane was sprayed for 5 minutes. Then, isopropyl alcohol (IPA) was sprayed while rotating the wafer to rinse. After that, the appearance was observed to visually check for remaining adhesive material resin. When no remaining resin was observed, the sample was evaluated as good and shown with "good". When remaining resin was observed, the sample was evaluated as poor and shown with "poor".

—Peeling Force Test—

Onto a 200-mm silicon wafer (thickness: 725 μm), the material corresponding to the layer (A) was applied by spin-coating, and then heated on a hot plate at 150° C. for 5 minutes to form a layer (A) having a film thickness shown in Table 3. Then, the solution of the photo-curing siloxane polymer corresponding to the layer (B) was applied by spin-coating onto the layer (A) formed on the silicon wafer, and then heated on a hot plate at 70° C. for 2 minutes to remove the solvent. Thus, the layer (B) was formed with a film thickness shown in Table 3. Thereafter, the layer (B) was subjected to irradiation with light at room temperature by using a plane-irradiation type UV-LED (365 nm) irradiator or was heated on a hot plate to cure the layer (B).

Then, five polyimide tapes with a length of 150 mm and a width of 25 mm were attached to the layer (B) on the wafer, and a part of the temporary adhesive material layer to which no tape had been attached was removed. Next, by using AUTOGRAPH (AG-1) manufactured by Shimadzu Co., 120 mm of the tapes were peeled off from one end by 180° peeling at a speed of 300 mm/minute at 25° C., and an average force applied at that time (120 mm stroke×5 times) was measured as a peeling force of the temporary adhesive layer (B). Table 3 shows the results.

—Film Modulus Measurement of Photo-Curing Siloxane Polymer Layer (B)—

A glass substrate was spin-coated with a solution of the photo-curing siloxane polymer corresponding to the layer (B) and heated at 70° C. for 2 minutes to remove the solvent. Thus, the layer (B) was formed on the glass substrate so as to have a film thickness given in Table 3. Subsequently, the photo-curing siloxane polymer layer (B) was subjected to irradiation with light at room temperature by using a plane-irradiation type UV-LED (365 nm) irradiator or was subjected to a heat treatment on a hot plate under the conditions shown in Table 3. Thus, a cured film of the layer (B) was formed on the glass substrate. The glass substrate, including the obtained layer (B), was sandwiched between 25-mm aluminum plates so that a load of 50 gf was applied to the layer (B) by using ARES-G2 manufactured by TA Instruments Company, the modulus at 25° C. was measured, and the value of the obtained storage modulus was taken as the film modulus of the layer (B). Table 3 shows the results.

TABLE 3

| | Example 1 | Example 2 | Example 3 | Example 4 | Example 5 | Example 6 | Example 7 | Comparative Example 1 | Comparative Example 2 | Comparative Example 3 | Comparative Example 4 |
|---|---|---|---|---|---|---|---|---|---|---|---|
| Wafer having circuit | Si | Si | Si | Si | Si | Si | Si | Si | Si | Si | Si |
| Resin layer (A) | A-1 | A-1 | A-1 | A-1 | A-1 | A-1 | A-1 | A-1 | — | A-1 | A-1 |
| Film thickness of layer (A) (µm) | 5 | 5 | 5 | 5 | 5 | 5 | 5 | 5 | — | 5 | 5 |
| Support | glass | glass | glass | glass | glass | glass | glass | glass | glass | glass | glass |
| Resin layer (B) | B-a | B-b | B-c | B-d | B-a | B-a | B-a | — | B-a | B-e | B-e |
| Film thickness of layer (B) (µm) | 50 | 60 | 70 | 50 | 50 | 50 | 50 | — | 50 | 50 | 50 |
| Curing conditions of layer (B) — Wavelength (nm) | 365 | 365 | 365 | 365 | 320-390 | 365 | 365 | — | 365 | 150° C. × 10 min (heat-curing) | 150° C. × 60 min (heat-curing) |
| Curing conditions of layer (B) — Light irradiation conditions | | 100 mW/cm$^2$ × 20 sec (2,000 mJ/cm$^2$) | | | | 100 mW/cm$^2$ × 10 sec (1,000 mJ/cm$^2$) | 100 mW/cm$^2$ × 40 sec (4,000 mJ/cm$^2$) | — | 100 mW/cm$^2$ × 20 sec (2,000 mJ/cm$^2$) | | |
| Peeling force of layer (B) (gf) | 10 | 18 | 5 | 20 | 12 | 9 | 11 | — | 68 | 80 | 12 |
| Film modulus of layer (B) (Pa) | 0.30 × 10$^5$ | 0.12 × 10$^5$ | 1.10 × 10$^6$ | 0.21 × 10$^5$ | 0.35 × 10$^5$ | 0.28 × 10$^5$ | 0.33 × 10$^5$ | — | 0.10 × 10$^5$ | 500 | 0.25 × 10$^5$ |
| Observation of wafer warpage | good | good | good | good | good | good | good | — | good | poor | poor |
| Adhesiveness | good | good | good | good | good | good | good | good | good | good | good |
| Back surface grinding resistance | good | good | good | good | good | good | good | poor, separated from support during grinding | good | — | — |
| CVD resistance | good | good | good | good | good | good | good | — | good | — | — |
| Delaminatability | good | good | good | good | good | good | good | — | poor | — | — |
| Cleaning removability | good | good | good | good | good | good | good | — | — | — | — |

As shown in Table 3, in Examples 1 to 7, which satisfy the requirements of the present invention, wafer warpage at the time of curing was reduced since it was possible to cure the temporary adhesive material layer without heating and in a short time. In addition, the samples had sufficient resistance to processing, and were also excellent in delaminatability, so that it was also observed that the cleaning removability after the delamination was excellent. On the other hand, in Comparative Example 1, in which the sample had no layer (B), the adhesion between the wafer having the circuit and the support was insufficient, so that the wafer became detached in the back surface grinding step. Meanwhile, in Comparative Example 2, in which the sample had no layer (A), the adhesiveness between the wafer and the layer (B) was strong, so that the cracking of the wafer occurred on delamination. In Comparative Example 3, a conventionally known heat curable type catalyst was used in the layer (B). Curing under the curing conditions of 150° C. and 10 min was insufficient, and peeling force was great and the film modulus showed a low value. In addition, wafer warpage during heat curing also occurred, so that it was not possible to go on to the subsequent wafer processing step. Meanwhile, in Comparative Example 4, a conventionally known heat curable type catalyst was used in the layer (B) as in Comparative Example 3, and the curing conditions were changed to 150° C.×60 min. In this case, although curing progressed sufficiently and reduction in peeling force was observed, wafer warpage during heat curing occurred, so that it was not possible to proceed to the wafer processing step.

Examples 8 to 10

Onto a silicon wafer having a diameter of 200 mm (thickness: 725 μm) whose entire surface was formed with copper posts having a height of 10 μm and diameter of 40 μm, the material (A-1), corresponding to the layer (A), was applied by spin-coating, and then heated on a hot plate at 150° C. for 5 minutes to form the layer (A) having a film thickness shown in Table 4 on the bump-formed surface of the wafer. Meanwhile, a silicon wafer having a diameter of 200 mm (thickness: 500 μm) to be used as a support was spin-coated with a solution of the photo-curing siloxane composition corresponding to the layer (B), and then heated at 70° C. for 2 minutes on a hot plate to form the layer (B) having a film thickness shown in Table 4 on the support. Next, the layer (B) was irradiated with light by using a plane-irradiation type UV-LED (wavelength: 365 nm) irradiator under the conditions shown in Table 4. The silicon wafer having the thermoplastic resin layer (A) and the silicon wafer having the photo-curing siloxane polymer layer (B) fabricated in this manner were vacuum bonded to each other so that the respective resin surfaces faced each other by using a wafer bonding apparatus EVG520IS manufactured by EVG Group at 40° C. under $10^{-3}$ mbar or less and a load of 5 kN. Thus, a wafer processing laminate was fabricated.

The evaluations other than the peeling force test and the film modulus measurement were carried out by the same operations as above regarding wafer processing. Methods for performing the peeling force test and the film modulus measurement are shown below. The evaluation results are shown in Table 4.

—Peeling Force Test—

Onto a 200-mm silicon wafer (thickness: 725 μm), the material corresponding to the layer (A) was applied by spin-coating, and then heated on a hot plate at 150° C. for 5 minutes to form a layer (A) having a film thickness shown in Table 4. Next, onto the layer (A), the solution of the photo-curing siloxane polymer corresponding to the layer (B) was applied by spin-coating, and then heated on a hot plate at 70° C. for 2 minutes to remove the solvent. Thus, the layer (B) was formed with a film thickness shown in Table 4. After that, irradiation with light was performed under the conditions shown in Table 4 by using a plane-irradiation type UV-LED (365 nm) irradiator, and furthermore, the laminate was then heated on a hot plate at 40° C. for 5 minutes to cure the layer (B).

Then, five polyimide tapes with a length of 150 mm and a width of 25 mm were attached to the layer (B) on the wafer, and a part of the temporary adhesive material layer to which no tape had been attached was removed. By using AUTOGRAPH (AG-1) manufactured by Shimadzu Co., 120 mm of the tapes were peeled off from one end by 180° peeling at a speed of 300 mm/minute at 25° C., and an average force applied at that time (120 mm stroke×5 times) was measured as a peeling force of the temporary adhesive layer (B).

—Film Modulus Measurement of Photo-Curing Siloxane Polymer Layer (B)—

A glass substrate was spin-coated with a solution of the photo-curing siloxane polymer corresponding to the layer (B), and then the solvent was removed by heating at 70° C. for 2 minutes. Thus, the layer (B) was formed on the glass substrate so as to have a film thickness shown in Table 4. Subsequently, irradiation with light was performed under the conditions shown in Table 4, and then a heat treatment was performed on a hot plate at 40° C. for 5 minutes to cure the layer (B). The glass substrate, including the obtained layer (B), was sandwiched between 25-mm aluminum plates so that a load of 50 gf was applied to the layer (B) by using ARES-G2 manufactured by TA Instruments Company, the modulus at 25° C. was measured, and the value of the obtained storage modulus was taken as the film modulus of the layer (B). Table 4 shows the results.

TABLE 4

|  | Example 8 | Example 9 | Example 10 |
| --- | --- | --- | --- |
| Wafer having circuit | Si | Si | Si |
| Resin layer (A) | A-1 | A-1 | A-1 |
| Film thickness of layer (A) (μm) | 5 | 5 | 5 |
| Support | Si | Si | Si |
| Resin layer (B) | B-a | B-c | B-a |
| Film thickness of layer (B) (μm) | 50 | 70 | 50 |

TABLE 4-continued

|  |  | Example 8 | Example 9 | Example 10 |
|---|---|---|---|---|
| Light irradiation conditions of layer (B) | Wavelength (nm) | 365 | 365 | 320-390 |
|  | Light irradiation conditions | 100 mW/cm² × 5 sec. (500 mJ/cm²) | 100 mW/cm² × 3 sec. (300 mJ/cm²) | 100 mW/cm² × 2 sec. (200 mJ/cm²) |
| Peeling force of layer (B) (gf) | | 11 | 7 | 15 |
| Film modulus of layer (B) (Pa) | | $0.25 \times 10^5$ | $0.95 \times 10^6$ | $0.28 \times 10^5$ |
| Observation of wafer warpage | | good | good | good |
| Adhesiveness | | good | good | good |
| Back surface grinding resistance | | good | good | good |
| CVD resistance | | good | good | good |
| Delaminatability | | good | good | good |
| Cleaning removability | | good | good | good |

As shown in Table 4, in Examples 8 to 10, which satisfy the requirements of the present invention, a wafer laminate was fabricated by subjecting the composition of the photo-curing siloxane polymer corresponding to the layer (B) to irradiation with light before the wafer-bonding, and it was confirmed that it was possible to achieve a wafer processing performance equivalent to the performance in Examples 1 to 7, in which the irradiation with light was performed after the wafer-bonding.

In Examples 8 to 10 (second embodiment), unlike Examples 1 to 7 (first embodiment), in which the irradiation with light is performed after bonding the wafer to the support, the photo-curing siloxane polymer layer (B) composition is irradiated with light before the bonding, so that the step of irradiation with light through the support is unnecessary, and a silicon wafer, which does not transmit light, can be used as the support. Moreover, as described above, it was confirmed that according to the present invention, a substrate that does not transmit light is also applicable as a support, since a wafer processing performance equivalent to that of Examples 1 to 7 was achieved.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A temporary adhesive material for wafer processing, the temporary adhesive material temporarily bonding a support to a wafer having a circuit-forming front surface and a back surface to be processed, comprising
a composite temporary adhesive material layer having a two-layer structure of a first temporary adhesive layer and a second temporary adhesive layer,
the first temporary adhesive layer comprising a thermoplastic resin layer (A) that can be releasably adhered to the front surface of the wafer; and
the second temporary adhesive layer comprising a photo-curing siloxane polymer layer (B) laminated on the first temporary adhesive layer, wherein the photo-curing siloxane polymer layer (B) is a cured layer of a photo-curing siloxane composition containing:
(B-1) an organopolysiloxane having two or more alkenyl groups in a molecule thereof;
(B-2) an organohydrogenpolysiloxane having two or more silicon atom-bonded hydrogen atoms (Si—H groups) per molecule in such an amount that a mole ratio of the Si—H groups in the component (B-2) to the alkenyl groups in the component (B-1) ranges from 0.3 to 10; and
(B-3) 1 to 5,000 ppm of a photoactive hydrosilylation reaction catalyst based on a total mass of the component (B-1) and the component (B-2) in terms of an amount of metal atoms.

2. The temporary adhesive material for wafer processing according to claim 1, wherein the photo-curing siloxane composition further contains a hydrosilylation reaction inhibitor as a component (B-4), and the component (B-3) is contained in an amount of 1 to 5,000 ppm based on a total mass of the component (B-1), the component (B-2), and the component (B-4) in terms of an amount of metal atoms.

3. The temporary adhesive material for wafer processing according to claim 2, wherein the photoactive hydrosilylation reaction catalyst of the component (B-3) is one or both of a ($\eta^5$-cyclopentadienyl)tri($\sigma$-alkyl)platinum(IV) complex and a $\beta$-diketonato platinum(II) complex.

4. The temporary adhesive material for wafer processing according to claim 2, wherein the photoactive hydrosilylation reaction catalyst of the component (B-3) is one or both of a ($\eta^5$-cyclopentadienyl)tri($\sigma$-alkyl)platinum(IV) complex and a $\beta$-diketonato platinum(II) complex.

5. The temporary adhesive material for wafer processing according to claim 1, wherein after the photo-curing siloxane polymer layer (B) is cured, a 180° peeling force against the thermoplastic resin layer (A) measured at 25° C. by using a test piece having a width of 25 mm is 2 gf (0.0196 N) or more and 50 gf (0.490 N) or less.

6. The temporary adhesive material for wafer processing according to claim 1, wherein after the photo-curing siloxane polymer layer (B) is cured, a storage modulus at 25° C. is 1,000 Pa or more and 1,000 MPa or less.

7. The temporary adhesive material for wafer processing according to claim 6, wherein the thermoplastic resin layer (A) is a non-silicone resin.

8. A method for manufacturing a thin wafer, comprising the steps of:
(a) bonding a support to a circuit-forming front surface of a wafer having the circuit-forming front surface and a non-circuit-forming back surface through a temporary adhesive material layer having the thermoplastic resin layer (A) and the photo-curing siloxane polymer layer (B) to be used for the temporary adhesive material for wafer processing according to claim 1 by forming the photo-curing siloxane polymer layer (B) on the support and bonding the resulting support to the wafer having a circuit and having the thermoplastic resin layer (A) formed under vacuum;

(b) photo-curing the polymer layer (B);

(c) grinding or polishing the non-circuit-forming back surface of the wafer bonded to the support;

(d) processing the non-circuit-forming back surface of the wafer; and (e) delaminating the processed wafer from the support.

9. A method for manufacturing a thin wafer, comprising the steps of:
(a) bonding a support to a circuit-forming front surface of a wafer having the circuit-forming front surface and a non-circuit-forming back surface through a temporary adhesive material layer having the thermoplastic resin layer (A) and the photo-curing siloxane polymer layer (B) to be used for the temporary adhesive material for wafer processing according to claim 1 by forming the thermoplastic resin layer (A) on the wafer having a circuit and forming on the support the photo-curing siloxane polymer layer (B) that is subjected to irradiation with light;

(b) bonding the wafer having a circuit and having the thermoplastic resin layer (A) formed to the support having the polymer layer (B) formed under vacuum;

(c) grinding or polishing the non-circuit-forming back surface of the wafer bonded to the support;

(d) processing the non-circuit-forming back surface of the wafer; and (e) delaminating the processed wafer from the support.

10. A wafer processing laminate comprising a temporary adhesive material layer formed on a support and a wafer laminated on the temporary adhesive material layer, the wafer having a circuit-forming front surface and a back surface to be processed, wherein
the temporary adhesive material layer has a composite temporary adhesive material layer having a two-layer structure of a first temporary adhesive layer and a second temporary adhesive layer,
the first temporary adhesive layer comprising a thermoplastic resin layer (A) that is releasably adhered to the front surface of the wafer; and
the second temporary adhesive layer comprising a photo-curing siloxane polymer layer (B) laminated on the first temporary adhesive layer, wherein the photo-curing siloxane polymer layer (B) is a cured layer of a photo-curing siloxane composition containing:

(B-1) an organopolysiloxane having two or more alkenyl groups in a molecule thereof;

(B-2) an organohydrogenpolysiloxane having two or more silicon atom-bonded hydrogen atoms (Si—H groups) per molecule in such an amount that a mole ratio of the Si—H groups in the component (B-2) to the alkenyl groups in the component (B-1) ranges from 0.3 to 10; and (B-3) 1 to 5,000 ppm of a photoactive hydrosilylation reaction catalyst based on a total mass of the component (B-1) and the component (B-2) in terms of an amount of metal atoms.

11. The wafer processing laminate according to claim 10, wherein the photo-curing siloxane composition further contains a hydrosilylation reaction inhibitor as a component (B-4), and the component (B-3) is contained in an amount of 1 to 5,000 ppm based on a total mass of the component (B-1), the component (B-2), and the component (B-4) in terms of an amount of metal atoms.

12. The wafer processing laminate according to claim 10, wherein the photoactive hydrosilylation reaction catalyst of the component (B-3) is one or both of a ($\eta^5$-cyclopentadienyl)tri($\sigma$-alkyl)platinum(IV) complex and a $\beta$-diketonato platinum(II) complex.

13. The wafer processing laminate according to claim 11, wherein the photoactive hydrosilylation reaction catalyst of the component (B-3) is one or both of a ($\eta^5$-cyclopentadienyl)tri($\sigma$-alkyl)platinum(IV) complex and a $\beta$-diketonato platinum(II) complex.

14. The wafer processing laminate according to claim 10, wherein after the photo-curing siloxane polymer layer (B) is cured, a 180° peeling force against the thermoplastic resin layer (A) measured at 25° C. by using a test piece having a width of 25 mm is 2 gf (0.0196 N) or more and 50 gf (0.490 N) or less.

15. The wafer processing laminate according to claim 10, wherein after the photo-curing siloxane polymer layer (B) is cured, a storage modulus at 25° C. is 1,000 Pa or more and 1,000 MPa or less.

* * * * *